(12) United States Patent  
Gau

(10) Patent No.: US 6,440,791 B1
(45) Date of Patent: Aug. 27, 2002

(54) SELF ALIGNED BIT-LINE CONTACT OPENING AND NODE CONTACT OPENING FABRICATION PROCESS

(75) Inventor: Jing-Horng Gau, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 5 days.

(21) Appl. No.: 09/690,193

(22) Filed: Oct. 16, 2000

(30) Foreign Application Priority Data

Oct. 5, 2000 (TW) .................................. 89120747 A

(51) Int. Cl.⁷ .......................................... H01L 21/8242
(52) U.S. Cl. ...................... 438/239; 438/303; 438/655; 438/664
(58) Field of Search ................................. 438/239, 303, 438/305, 306, 307, 655, 664, 656, 657

(56) References Cited

U.S. PATENT DOCUMENTS 5,953,614 A * 9/1999 Liu et al.

* cited by examiner

Primary Examiner—Wael Fahmy
Assistant Examiner—D. M. Collins
(74) Attorney, Agent, or Firm—J.C. Patents

(57) ABSTRACT

A self-aligned bit-line contact opening and node contact opening fabrication process having the following features: Etching of the periphery MOS spacer is performed before ion implantation of the periphery MOS source/drain region, using the same photoresist layer as a mask. A self-aligned bit-line (node) contact opening and a periphery gate contact opening, above the periphery MOS gate, are formed simultaneously. The etching of the memory cell MOS spacer is performed after the self-aligned bit-line (node) contact opening has been formed. At the same time, the cap layer above the periphery MOS gate, exposed by the periphery gate contact opening, is etched through.

14 Claims, 4 Drawing Sheets

SELF ALIGNED BIT-LINE CONTACT OPENING AND NODE CONTACT OPENING FABRICATION PROCESS

CROSS-REFERENCE TO RELATED APPLICATION

This application claims the priority benefit of Taiwan application serial no. 89120747, filed Oct. 5, 2000.

BACKGROUND OF THE INVENTION

1. Field of the Invention

The present invention relates to a memory fabrication process. More particularly, the present invention relates to a self-aligned bit-line contact and node contact fabrication process.

2. Description of the Related Art

In the existing semiconductor fabrication processes, self-aligned contact (SAC) fabrication processes are often used to increase the alignment margin of the contact opening. The steps in the self-aligned contact process are as follows: a metal oxide semiconductor (MOS) gate and a cap layer above the gate are formed. A spacer is formed on a sidewall of the gate and cap layer. A dielectric layer is deposited over the substrate. A lithography and an etching process are conducted, to etch a self-aligned contact opening in the dielectric layer, on opposite sides of the gate. The self-aligned contact opening has a width greater than the distance between the gates, to assure that the source/drain region of the MOS is exposed. During the etching process, the gate are protected by the cap layer and the spacer. Thus, the gate is not exposed. The self-aligned contact is very wide. Consequently, even if there is a significant error in alignment, the contact opening formed in later steps is able to make contact with the source/drain region, which indicates that the alignment margin of the self-aligned contact is very high.

In the fabrication process of a memory, the self-aligned contact openings that must be formed above the source/drain region in the MOS of the memory cell are the self-aligned bit-line contact and self-aligned node contact, respectively. In the memory, gate contacts are located on some periphery MOS gates to form an electrically connection with the periphery gate contacts, so that to control the turn-on and turn-off of the periphery MOS can be controlled. The fabrication process of a self-aligned contact and periphery gate contact in a conventional memory is outlined below.

As shown in FIG. 1A, a substrate 100 having memory cell MOS 120 and periphery MOS active region 110 is provided, wherein gate dielectric layer 122 has been formed over periphery MOS active region 110, periphery MOS gate 130a has been formed over gate dielectric layer 122, cap layer 133a, composed of silicon nitride, has been formed over periphery MOS gate 130a and lightly doped drains (LDD) 150 have been formed in the substrate on opposite sides of MOS gate 130a. Memory cell MOS 120 includes gate dielectric layer 122, memory cell MOS gate 130b above gate dielectric layer 122, cap layer 133b, composed of silicon nitride, above memory cell MOS gate 130b, and memory cell source/drain region 154 in substrate 100 on opposite sides of memory cell MOS gate 130b. Isolation layer 120 isolates memory cell MOS 120. Conformal liner oxide layer 142 and a silicon nitride layer (not shown) are formed sequentially over substrate 100. Liner oxide layer functions to reduce the stress of the silicon nitride layer. An anisotropic etching operation is performed on the silicon nitride layer, to form spacer 143a on the sidewall of the periphery MOS gate 130a and cap layer 133a. At the same time spacer 143b is formed on the sidewall of memory cell MOS gate 130b and cap layer 133b. It should be pointed out that the specification uses the processing steps of periphery MOS active region 110 to represent the processing steps used for the NMOS active region and PMOS active region, in the periphery circuit. In this manner, the description can further simplified.

As shown in FIG. 1B, two photolithographic processes are performed respectively on the NMOS active region and PMOS active region, in order to form photoresist layer 158, which covers memory cell MOS 120. As mentioned above, the specification uses the processing steps of periphery MOS active region 110 to represent processing steps used for the NMOS active region and PMOS active region, in the periphery circuit. Thus, photoresist layer 158 represents the two layers formed as a result of two photolithographic processes on the top portion of the memory cell MOS 120. Using photoresist layer 158, cap layer 133a and spacer 143a as a mask, ions 159 are implanted to form a periphery source/drain region in substrate 100, on opposite sides of spacer 143a. This step completes the fabrication of periphery MOS 110a.

The specification uses the processing steps of periphery MOS active region 110 to represent processing steps used for the NMOS active region and PMOS active region, in the periphery circuit. Thus, the etching of spacer 143a and the step of implanting ions 159, represent each spacer etching step and ion implantation step for both the periphery NMOS active region and PMOS active region.

As shown in FIG. 1C, substrate 100 is covered by silicon oxide layer 170. A third photolithography and an etching process are performed to form self-aligned bit-line contact opening 175, self-aligned node contact opening 176, and periphery gate contact opening 177 in silicon oxide layer 170. At the same time, liner oxide layer 142, exposed by self-aligned bit-line contact opening 175 and self-aligned node contact opening 176, is removed. Self-aligned bit-line contact opening 175 and self-aligned node contact opening 176 expose memory cell source/drain region 154. The width of contact openings 175 and 176 is greater than the distance between memory cell MOS gate 130b. Periphery gate contact opening 177 exposes cap layer 133a of periphery MOS 110a.

As shown in FIG. 1D, a fourth photolithographic process is performed to cover the memory cell MOS 120 with photoresist layer 180 used to protect cap layer 133b and spacer 143b of the memory cell MOS. A silicon nitride etching step is performed to etch through cap layer 133a of the memory MOS cell, exposing periphery MOS gate 130a, in order to connect MOS gate 130a and the contact opening, formed in a subsequent step.

The above description and accompanying illustrations, reveal a characteristic in the fabrication process of a conventional memory self-aligned contact opening and periphery gate contact opening. Between the completion of memory cell source/drain region 154 and the lightly doped drain (LDD) 150 of periphery MOS 110a and the completion of contact openings 175, 176, and 177, a total of four photolithographic processes are performed. First, during the formation of periphery source drain region 160, two photolithographic processes are required. During the formation of periphery gate contact opening 177 and self-aligned bit-line (node) contact openings 175(176), a third photolithographic process is required. During the etch-through of cap layer 133a of the periphery MOS a fourth photolithographic process is required. The excessive number of photolithographic etching steps, makes the conventional fabrication process more complicated. Additionally, because a great portion of the cap layer composed of silicon nitride may be consumed during the etching of the self-aligned bit-line (node) contact opening 175 (176), cap layer 133b must be rather thick, which often causes excessive stress.

SUMMARY OF THE INVENTION

The present invention provides a self-aligned bit-line contact opening and node contact opening fabrication process, that only requires three photolithographic etching steps to form the periphery MOS source/drain region, the periphery gate contact opening and the self-aligned bit-line (node) contact opening, and etching of the cap layer above the periphery MOS gate. The steps of the fabrication process are as follows: a substrate is provided having a periphery MOS active region and memory cell MOS, wherein the periphery MOS active region has a first gate, and a cap layer above the first gate, and further wherein the memory cell MOS includes a second gate, a second cap layer above the second gate, and a second memory cell source/drain region in the substrate on opposite sides of the second gate.

A conformal insulation layer is then formed above the substrate. The material of the insulation layer is similar to the material of the first and second cap layers. The memory cell MOS is covered with a photoresist layer. Using the photoresist layer as a mask, anisotropic etching is performed on the insulation layer above the periphery MOS active region, to form a first spacer on a sidewall of the first gate and first cap layer. Using the photoresist, the first spacer, and the first cap layer as a mask, ions are implanted to form a periphery source/drain region in the substrate on opposite sides of the first spacer. This step completes the fabrication of a periphery MOS.

The photoresist layer is then removed. A dielectric layer is deposited over the substrate. A self-aligned bit-line contact opening and a self aligned node contact opening are formed in the dielectric layer on opposite sides of the second gate, to expose part of the insulation layer. At the same time, a periphery gate contact opening is formed in the dielectric layer above the first gate, to expose part of the first cap layer. Anisotropic etching is performed on the insulation layer of the self-aligned bit-line contact opening and the self-aligned node contact opening to form a second spacer on a sidewall of the second gate and second cap layer. At the same time the cap layer within the periphery gate contact opening is etched through, which exposes the first gate.

In the present invention, the material of the dielectric layer can be silicon oxide. The fabrication method further includes the step of forming a conformal liner oxide layer before forming the insulation layer above the substrate, and exposing the liner oxide layer after the second spacer has been formed. Additionally, the periphery MOS of the present invention further includes a lightly doped drain (LDD) in the substrate on opposite sides of the first gate. Moreover, the periphery contact opening can be a periphery bit-line contact opening for example.

In the fabrication process of a self-aligned bit-line contact opening and node contact opening of the present invention, the step of etching the memory cell MOS spacer is combined with the later step of etching through the periphery MOS cap layer. Thus, it is not necessary to use a fourth photolithographic process to protect the region of the memory cell MOS. That is to say, the number of photolithographic processes required can be reduced to three. As the self-aligned bit-line (node) contact opening are being etched, the first cap layer above the memory cell MOS gate can provide protection. Additionally, the insulation layer above the cap layer can serve as protection. Thus, the thickness of the first cap layer can be reduced, which results in reduced stress. The present invention has an additional feature. The etching of the periphery MOS spacer and ion implantation step of the periphery MOS source/drain region are performed using the same photoresist as a mask and, thus, does not increase the number of photolithographic processes.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention. In the drawings.

DESCRIPTION OF THE PREFERRED EMBODIMENTS

Figure 1A:
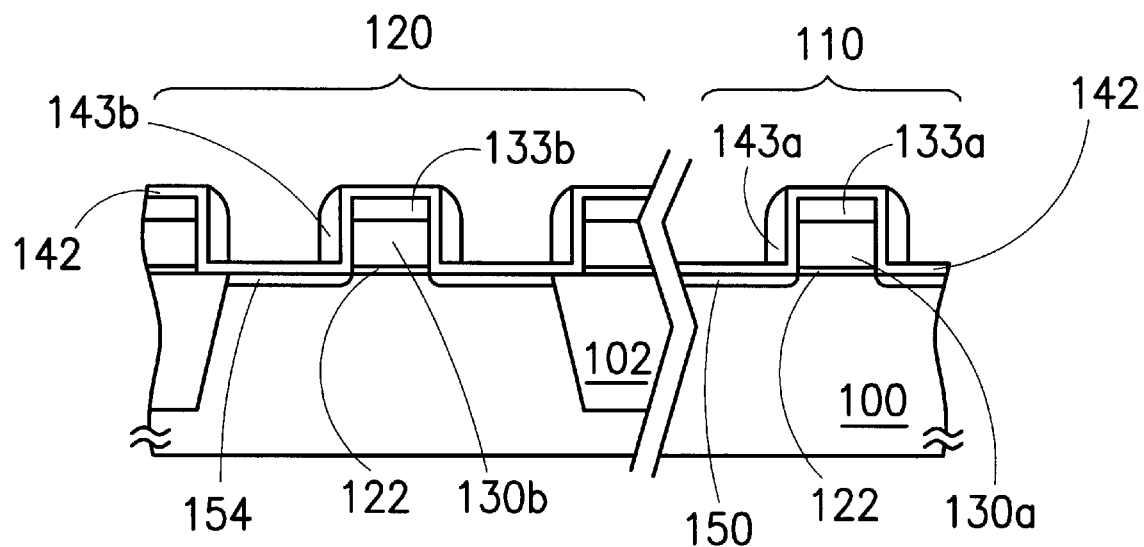
FIGS. 1A–1D are schematic drawings showing the process of fabricating a conventional self-aligned bit line contact opening and a node contact.
Figure 1B:
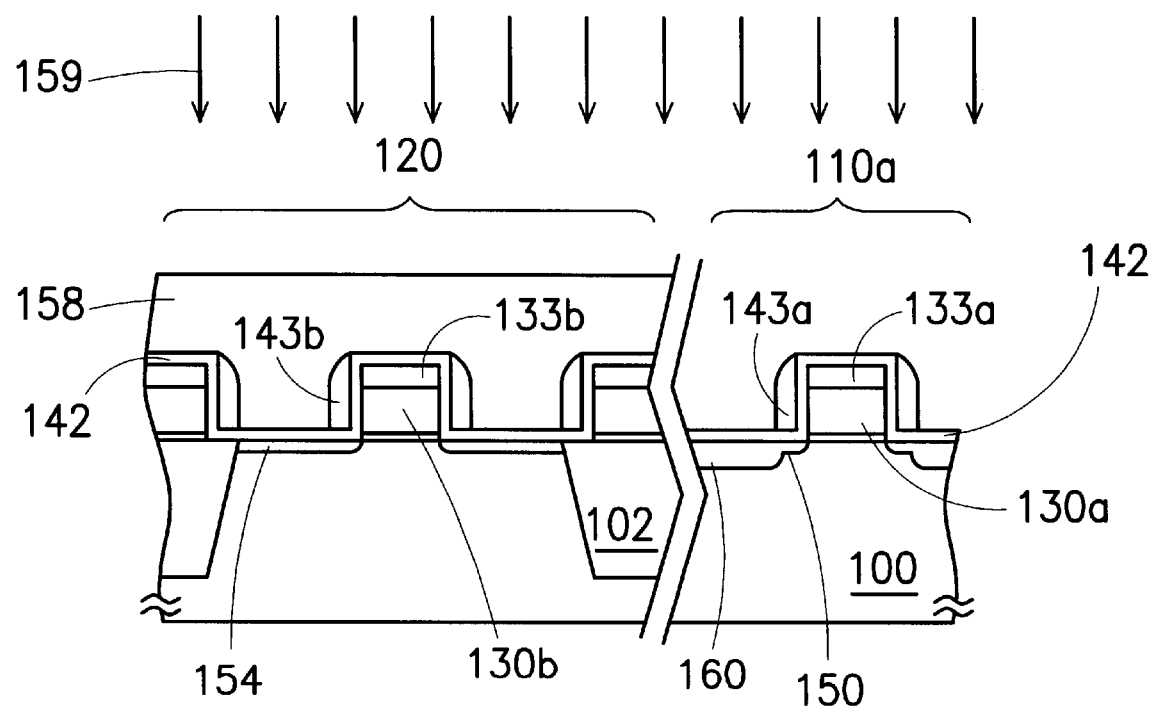
Figure 1C:
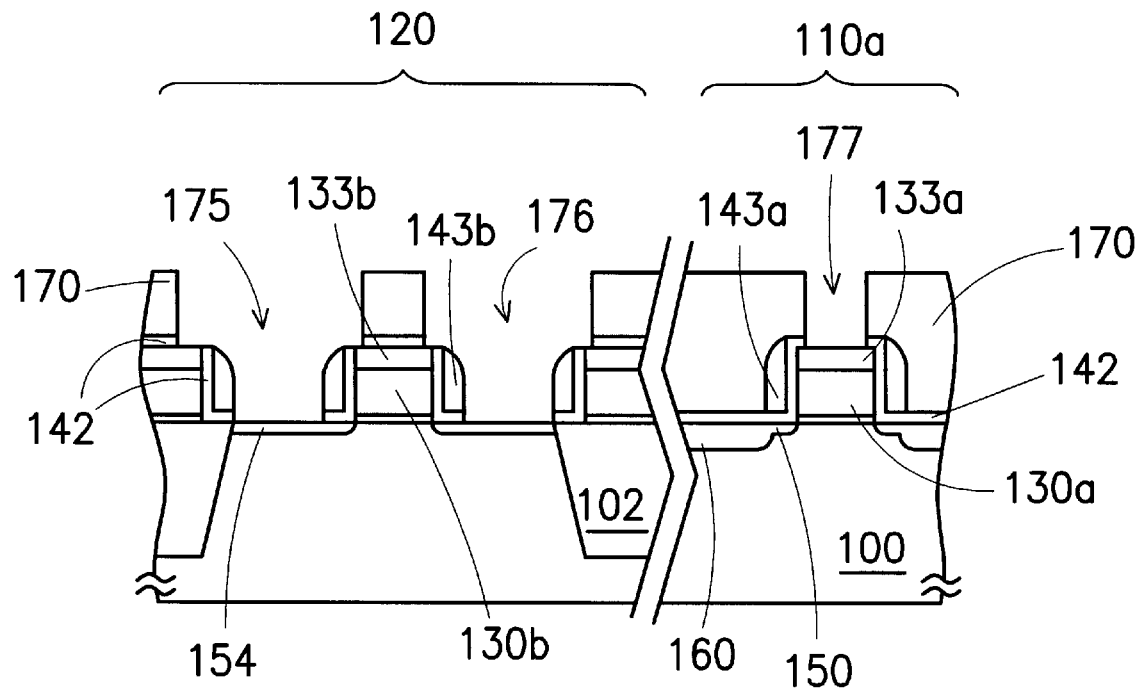
Figure 1D:
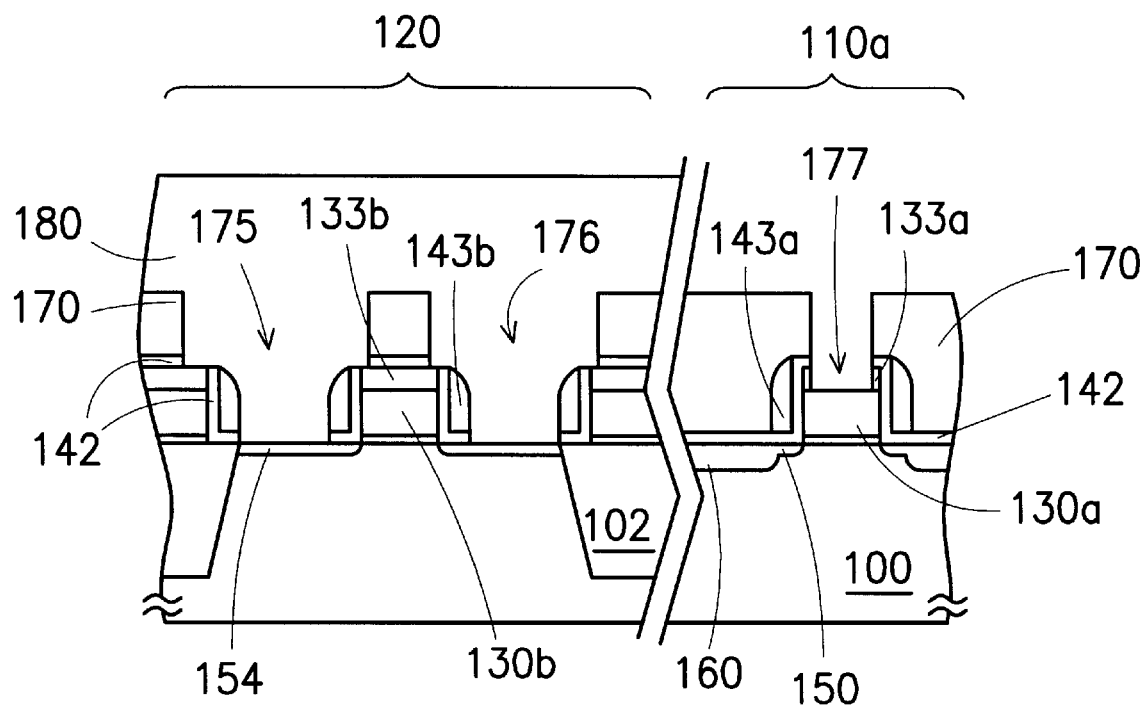
Figure 2A:
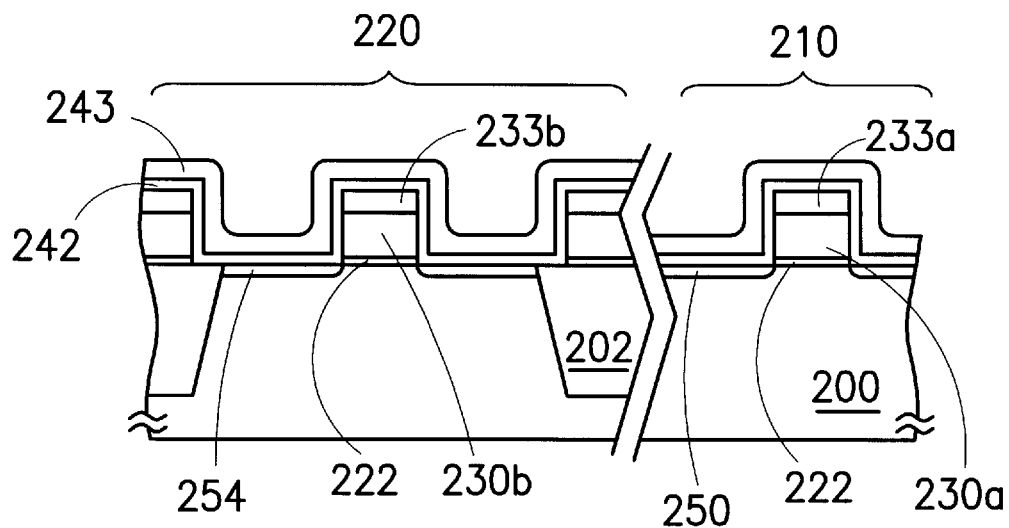
FIGS. 2A–2D are schematic drawings showing the process of fabricating a self aligned bit line contact opening and node contact opening according to one preferred embodiment of this invention.
Figure 2B:
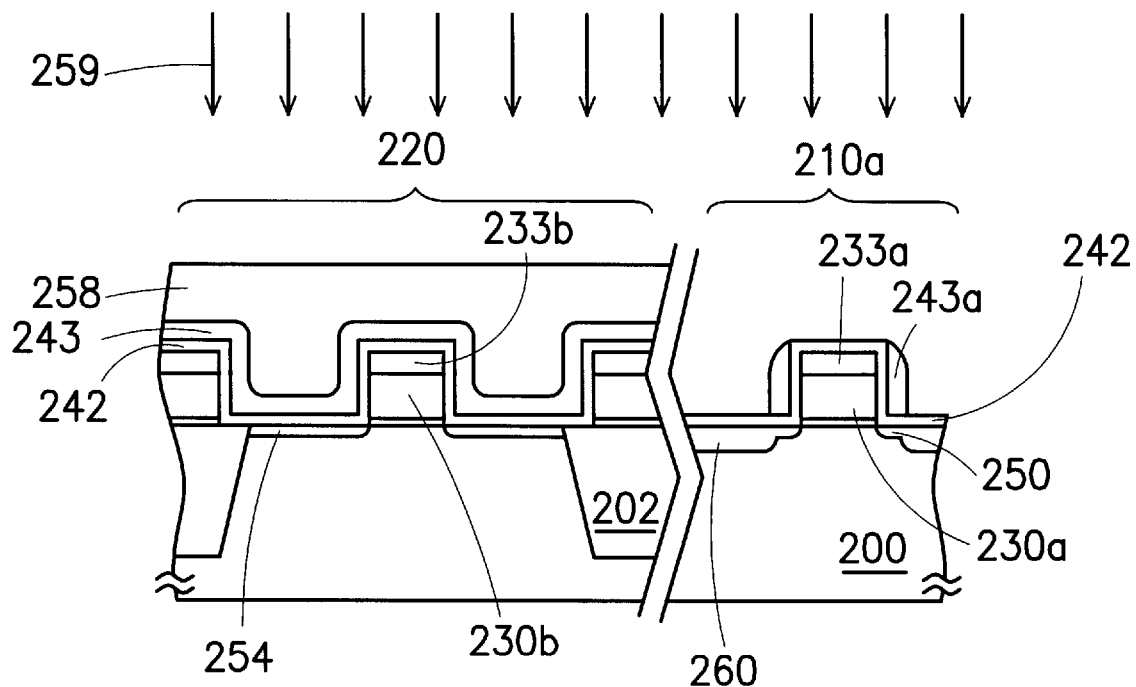

As shown in FIG. 2A, a substrate 200 having periphery MOS active region 210 and memory cell MOS 220 is provided, wherein the periphery MOS active region has a gate dielectric layer 222, a periphery MOS gate 230a on top of gate dielectric layer 222, a cap layer 233a on top of periphery MOS gate 230a and a lightly doped drain (LDD) 250 in the substrate, on opposite sides of periphery MOS gate 230a. The memory cell MOS 220 includes gate dielectric layer 222, memory cell MOS gate 230b above gate dielectric layer 222, cap layer 233b above memory cell MOS gate 230b and memory cell source/drain region 254 in substrate 200 on opposite sides of memory cell MOS gate 230b. It should be noted that in this specification, the fabrication process of only one periphery MOS active region is used to represent the fabrication process of an NMOS and PMOS active region in the periphery circuit. This approach makes the description simpler.

As shown in FIG. 2A, liner oxide layer 242 and insulation layer 243 are formed sequentially over substrate 200, wherein insulation layer 243 is used to form a spacer. Liner oxide layer 242 is used to reduce the stress created by insulation layer 243. The material for insulation layer 243 and cap layers 233a(b) is similar. The material can be, for example, silicon nitride. The silicon nitride material of insulation layer 243 has a thickness between 500 Å and 1000 Å.

As shown in 2B, photolithography is conducted twice (on the NMOS active region and PMOS active regions, respectively) to cover memory cell MOS 220 with photoresist layer 258. In this specification only one periphery MOS active region 210 is used to represent NMOS and PMOS active regions in the periphery circuit. Thus, photoreist layer 258 represents the portion of the photoresist layer over memory cell MOS 220, in the two photolithographic processes. Using photoresist layer 258 as a mask, anisotropic etching procedure is performed on insulation layer 243 above periphery MOS active region 210, to form spacer 243a on a sidewall of periphery MOS gate 230a and cap layer 233a. Using photoresist layer 258, cap layer 233a, and spacer 243a as a mask, ion implantation is conducted, to form periphery source/drain region 260 in substrate 200, on opposite sides of spacer 243a, completing the fabrication of periphery MOS 210a. In this specification, only one periphery MOS active region 210 is used to represent NMOS and PMOS active regions in the periphery circuit. Thus, the etching of spacer 243a and ion implantation step 259 also represent the spacer etching steps and ion implantation steps performed on the NMOS and PMOS active regions, after each photolithographic process.

Figure 2C:
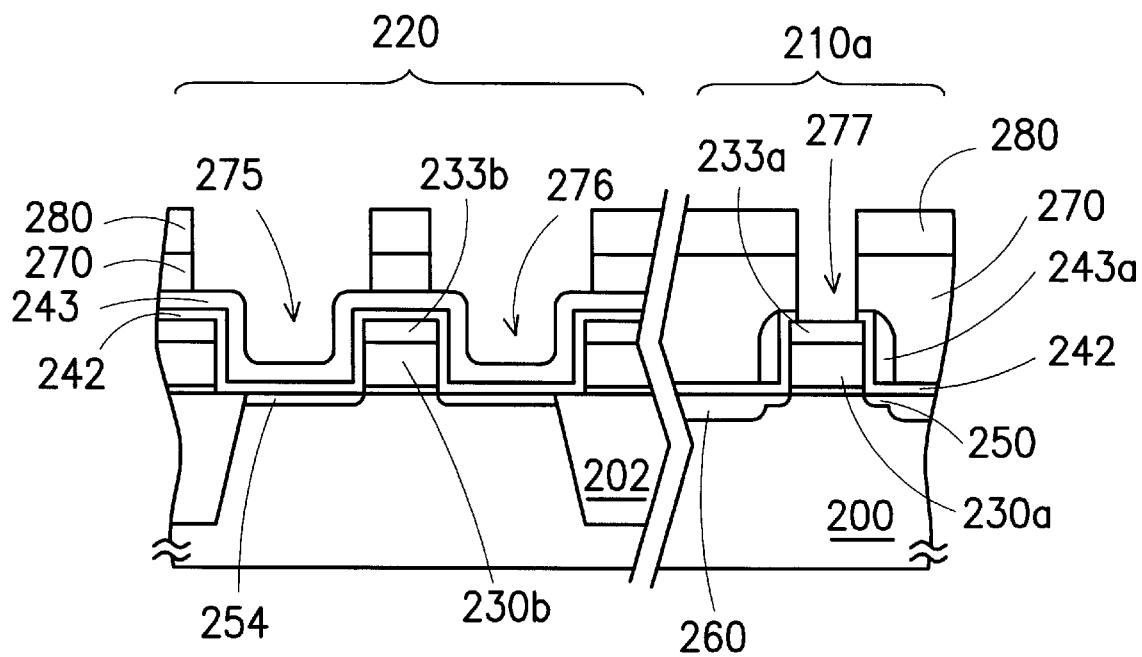

As shown in FIG. 2C, dielectric layer 270 is deposited over substrate 200. The material of dielectric layer 270 can be silicon oxide, for example. A third photolithographic process is conducted to form patterned photoresist layer 280 above dielectric layer 270. Using photoresist layer 280 as a mask, dielectric layer 270 is etched to form self-aligned bit-line contact opening 275 and self-aligned node contact opening 276 in dielectric layer 270 on opposite sides of memory cell MOS gate 230b, to expose a portion of insulation layer 243. At the same time, periphery gate contact opening 277 is formed in the dielectric layer above periphery MOS gate 230a, to expose cap layer 233a. Periphery gate contact opening 277 can be a periphery bit line contact, for example.

Figure 2D:
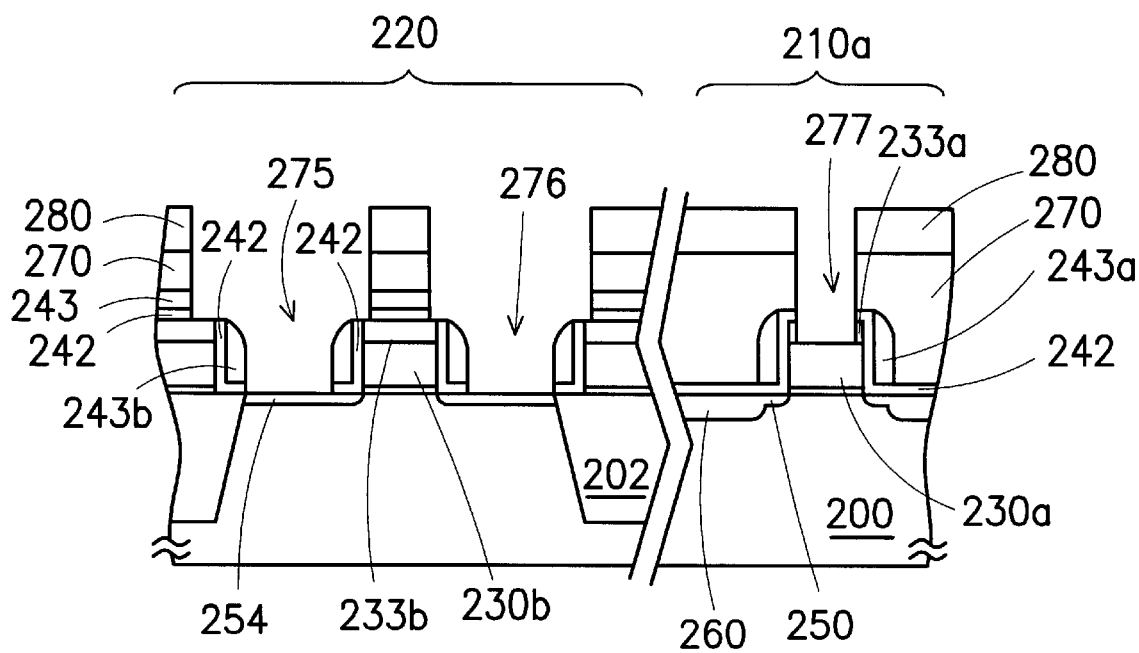

As shown in FIG. 2D, using photoresist layer 280 as a mask, anisotropic etching is performed on self-aligned bit-line contact opening 275 and insulation layer 243 in self-aligned node contact opening, to form spacer 243b on the sidewalls of memory cell MOS gate 230b and cap layer 233b. At the same time, cap layer 233a in periphery gate contact opening 277 is etched through, to expose periphery MOS gate 230a, so that periphery MOS gate 230a can be connected to a gate contact in a later step. A silicon oxide etching step is performed, to etch away exposed liner oxide layer 242 and to expose memory cell source/drain region 254, which allows a connection between the bit-line contact opening and node contact opening to be formed in a later step.

In the fabrication of a self-aligned bit-line contact opening and node contact opening as embodied and described herein, the step of etching spacer 243b is combined with the later step of etching through cap layer 233a (FIG. 2D). Thus, by using the method of the present invention it is not necessary to perform a fourth photolithographic process to protect cap layer 133b and spacer 143b of memory MOS 120, as is the case in the conventional art. In other words, the number of photolithographic processes required can be reduced to three.

Based on the preferred embodiments of the present invention, the top of memory cell MOS gate 230b is protected by cap layer 233b. Moreover, insulation layer 243 on top of cap layer 233b can also provide protection. Thus, the thickness of cap layer 233b can be reduced, which reduces stress. The present invention has an additional feature. Specifically, the etching of spacer 243a and the ion implantation of periphery source/drain region 260 use the same photoresist layer 258 as a mask (FIG. 2). Thus, the number of photolithographic processes does not increase.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A self-aligned bit-line contact opening and node contact opening fabrication process, comprising the following steps:

providing a substrate having a periphery MOS active region and a memory MOS, wherein a first gate is formed on the periphery MOS active region, and a first cap layer is formed on the first gate, and where the memory cell MOS includes a second gate, a second cap layer on top of the second gate, and a source/drain region in the substrate on opposite sides of the second gate;

forming a conformal insulation layer above the substrate, that uses a material same as the first cap layer and the second cap layer;

covering the memory MOS with a photoresist layer;

performing anisotropic etching on the periphery MOS active region, using the photoresist as a mask, to form a first spacer on a sidewall of the first gate and first cap layer;

performing an ion implantation step, using the photoresist layer, the first cap layer and the first spacer as a mask, to form a source/drain region in the substrate on opposite sides of the first spacer, completing the periphery MOS;

removing the photoresist layer;

depositing a dielectric layer over the substrate;

forming a self-aligned bit-line contact opening and a self-aligned node contact opening in the dielectric layer on opposite sides of the second gate, as well as exposing a portion of the insulation layer, and simultaneously forming a periphery gate contact opening in the dielectric layer above the first gate, to expose the first cap layer; and performing an anisotropic etching step on the insulation layer in the self-aligned bit line contact opening and the self-aligned node contact opening, to form a second spacer on a sidewall of the second gate and second cape layer, and simultaneously etching through the first cap layer in the periphery gate contact opening, to expose the first gate.

2. The process of claim 1, further including a step of forming a conformal liner oxide layer above the substrate before forming the insulation layer, and a step of etching away the exposed liner oxide layer after forming the second spacer.

3. The process of claim 1, wherein the insulation layer includes a silicon nitride layer.

4. The process of claim 1, wherein a thickness of the silicon nitride layer lies between 500 Å and 1000 Å.

5. The process of claim 1, wherein a material of the dielectric layer includes silicon oxide.

6. The process of claim 1, wherein the periphery MOS active region further includes a lightly doped drain (LDD) in the substrate on opposites sides of the first gate.

7. The process of claim 1, wherein the periphery gate contact opening is a periphery bit-line contact opening.

8. A contact opening fabrication process comprising the following steps:

providing a substrate having a periphery region and a memory cell region, wherein a first gate is formed on the periphery region and a first cap layer is formed on top of the first gate, and where a memory cell transistor is formed in the memory cell region, and where the transistor includes a second gate and a second cap layer on top of the second gate;

forming a conformal insulation layer having material same as the first and second cap layers above the substrate;

forming a peripheral transistor, using a photoresist as a mask, wherein the periphery transistor comprises a gate, a first sidewall spacer, and a periphery source/drain region in the substrate on opposite sides of the first spacer;

removing the photoresist layer;

depositing a dielectric layer above the substrate;

forming a contact opening in the dielectric layer, on one side of the second gate, to expose the second cap layer and simultaneously forming a periphery contact opening in the dielectric layer above the first gate to expose the first cap layer; and removing the insulation layer within the contact opening to form a second spacer on the sidewall of the second gate and second cap layer, and simultaneously etching through the first cap layer in the periphery gate contact opening, to expose the first gate.

9. The process of claim 8, wherein the fabrication further includes a step of forming a conformal liner oxide layer over the substrate before forming a silicon oxide layer over the substrate and a step of etching away the liner oxide layer after forming the second spacer.

10. The process of claim 8, wherein the insulation layer includes a silicon nitride insulation layer.

11. The process of claim 8, wherein a thickness of the silicon nitride layer lies between 500 Å and 1000 Å.

12. The process of claim 8, wherein a material of the dielectric layer includes silicon oxide.

13. The process of claim 8, wherein the periphery region further includes a lightly doped drain (LDD) in the substrate on opposite sides of the first gate.

14. The process of claim 8, wherein periphery contact opening is a periphery bit-line contact opening.

* * * * *